US012787516B2

(12) United States Patent
Wu et al.

(10) Patent No.: US 12,787,516 B2

(45) Date of Patent: Nov. 3, 2026

(54) LIGHT EMITTING DIODE STRUCTURE

(71) Applicant: AUO Corporation, Hsin-Chu (TW)

(72) Inventors: Yang-En Wu, Hsin-Chu (TW); Tzu-Hsuan Yang, Hsin-Chu (TW); Chun-Hung Kuo, Hsin-Chu (TW); Chao-Chien Chiu, Hsin-Chu (TW); Teng-Wei Huang, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 356 days.

(21) Appl. No.: 18/542,819

(22) Filed: Dec. 18, 2023

(65) Prior Publication Data

US 2025/0006875 A1 Jan. 2, 2025

(30) Foreign Application Priority Data

Jun. 30, 2023 (TW) ................................ 112124610

(51) Int. Cl.

*H10H 20/855* (2025.01)
*H10H 29/14* (2025.01)

(52) U.S. Cl.

CPC ........ *H10H 20/855* (2025.01); *H10H 29/142* (2025.01)

(58) Field of Classification Search

CPC ........................... H10H 20/855; H10H 29/142

See application file for complete search history.

(56) References Cited

U.S. PATENT DOCUMENTS

| | | | |
|---|---|---|---|
| 6,803,894 B1 | 10/2004 | Hirota et al. | |
| 2007/0109779 A1 | 5/2007 | Sekiguchi et al. | |
| 2008/0025019 A1* | 1/2008 | Kim | G02F 1/133603 362/231 |
| 2008/0123022 A1 | 5/2008 | Aoki et al. | |
| 2008/0239718 A1 | 10/2008 | Huttner et al. | |
| 2010/0033649 A1 | 2/2010 | Aoki et al. | |
| 2010/0066943 A1 | 3/2010 | Akiba et al. | |
| 2013/0201426 A1 | 8/2013 | Matsuki et al. | |
| 2017/0069611 A1* | 3/2017 | Zhang | H10W 90/00 |

(Continued)

FOREIGN PATENT DOCUMENTS

| | | |
|---|---|---|
| CN | 111640879 A | 9/2020 |
| CN | 112216219 A | 1/2021 |

(Continued)

*Primary Examiner* — Shih Tsun A Chou

(74) *Attorney, Agent, or Firm* — WPAT, PC

(57) ABSTRACT

The present disclosure provides a light emitting diode structure. The light emitting diode structure includes a substrate, a first light emitting structure on the substrate, a second light emitting structure on the substrate, and a third light emitting structure on the substrate. The first light emitting structure includes a first light emitting diode and a first focusing optic on the first light emitting diode. The second light emitting structure includes a second light emitting diode and a second focusing optic on the second light emitting diode. The third light emitting structure includes a third light emitting diode and a third focusing optic on the third light emitting diode. The first light emitting structure, the second light emitting structure and the third light emitting structure are arranged along a first direction and are dislocated in a second direction perpendicular to the first direction.

7 Claims, 11 Drawing Sheets

(56) References Cited

U.S. PATENT DOCUMENTS

| | | | | |
|---|---|---|---|---|
| 2020/0135977 | A1* | 4/2020 | Leung | H10H 20/819 |
| 2020/0234661 | A1 | 7/2020 | Aoki et al. | |
| 2021/0096283 | A1* | 4/2021 | Li | H10W 90/00 |
| 2021/0202917 | A1 | 7/2021 | Lee et al. | |
| 2022/0199587 | A1 | 6/2022 | Huang et al. | |
| 2024/0120446 | A1 | 4/2024 | Leung et al. | |

FOREIGN PATENT DOCUMENTS

| | | | |
|---|---|---|---|
| CN | 114280793 | B | 4/2023 |
| CN | 219264063 | U | 6/2023 |
| TW | I567454 | B | 1/2017 |
| TW | 202042313 | A | 11/2020 |

* cited by examiner

LIGHT EMITTING DIODE STRUCTURE

CROSS-REFERENCE TO RELATED APPLICATION

This application claims priority to Taiwan Application Serial Number 112124610, filed Jun. 30, 2023, which is herein incorporated by reference in its entirety.

BACKGROUND

Field of Disclosure

The present disclosure relates to a light emitting diode structure.

Description of Related Art

Display panels are widely used in daily life, in which light emitting diodes as light sources of the display panels have a significant impact on the imaging quality of display panels. For example, good imaging quality needs to avoid unexpected displacement of light emitted by the light sources, which may cause display pattern displacement. Good imaging quality also requires good display resolution to meet various needs. For the differences in the existing light sources of different light types (such as different color light), it is also necessary to control different light types differently to obtain better imaging quality (such as more uniform display brightness). In other words, depending on various circumstances, a light emitting diode structure is needed to well control the light emitted by the light emitting diode and solve the above problems.

SUMMARY

The present disclosure provides a light emitting diode structure. The light emitting diode structure includes a substrate, a first light emitting structure, a second light emitting structure, and a third light emitting structure. The first light emitting structure is on the substrate, where the first light emitting structure includes a first light emitting diode and a first focusing optic, and the first focusing optic is on the first light emitting diode. The second light emitting structure is on the substrate, where the second light emitting structure includes a second light emitting diode and a second focusing optic, and the second focusing optic is on the second light emitting diode. The third light emitting structure is on the substrate, where the third light emitting structure includes a third light emitting diode and a third focusing optic, and the third focusing optic is on the third light emitting diode. The first light emitting structure, the second light emitting structure and the third light emitting structure are arranged along a first direction and are dislocated in a second direction perpendicular to the first direction.

In some embodiments, the second focusing optic has an edge tangent parallel to the second direction and extending through the first focusing optic or the third focusing optic.

In some embodiments, the projections of the first light emitting structure and the second light emitting structure in the second direction have an overlap length of 0.1 μm to 10 μm.

In some embodiments, a first maximum width of the first focusing optic is 1.1 times to 2 times a pitch between the first light emitting structure and the second light emitting structure in the first direction.

In some embodiments, a first maximum width of the first focusing optic is 25 μm to 50 μm, a second maximum width of the second focusing optic is 25 μm to 50 μm, and a third maximum width of the third focusing optic is 25 μm to 50 μm.

In some embodiments, a first distance between a lower surface of the first focusing optic and an upper surface of the first light emitting diode is 10 μm to 150 μm, a second distance between a lower surface of the second focusing optic and an upper surface of the second light emitting diode is 10 μm to 150 μm, and a third distance between a lower surface of the third focusing optic and an upper surface of the third light emitting diode is 10 μm to 150 μm.

In some embodiments, the first light emitting diode, the second light emitting diode and the third light emitting diode are selected from the group consisting of a red light emitting diode, a green light emitting diode and a blue light emitting diode, and the light emitting colors of the first light emitting diode, the second light emitting diode and the third light emitting diode are different.

The present disclosure also provides a light emitting diode structure. The light emitting diode structure includes a substrate and at least one first light emitting structure. The at least one first light emitting structure includes at least one first red light emitting diode, a first green light emitting diode, a first blue light emitting diode and a first focusing optic. The at least one first red light emitting diode, the first green light emitting diode and the first blue light emitting diode are located on the substrate. The first focusing optic completely covers the at least one first red light emitting diode, the first green light emitting diode and the first blue light emitting diode.

In some embodiments, an arrangement of the at least one first red light emitting diode, the first green light emitting diode and the first blue light emitting diode is a quadrangular arrangement, a triangular arrangement or a rectilinear arrangement.

In some embodiments, the number of the at least one first red light emitting diode is plural, and the at least one first red light emitting diode is located on a diagonal line of the quadrangular arrangement.

In some embodiments, when viewed from the top, the area of the at least one first red light emitting diode is greater than the area of the first green light emitting diode and the area of the first blue light emitting diode.

In some embodiments, the light emitting diode structure further includes at least one second light emitting structure next to the at least one first light emitting structure. The at least one second light emitting structure includes at least one second red light emitting diode, a second green light emitting diode, a second blue light emitting diode and a second focusing optic. The at least one second red light emitting diode, the second green light emitting diode and the second blue light emitting diode are located on the substrate. The second focusing optic covers the at least one second red light emitting diode, the second green light emitting diode and the second blue light emitting diode, where a first arrangement of the at least one first red light emitting diode, the first green light emitting diode and the first blue light emitting diode is different from a second arrangement of the at least one second red light emitting diode, the second green light emitting diode and the second blue light emitting diode.

In some embodiments, the first arrangement and the second arrangement are a first quadrangular arrangement and a second quadrangular arrangement, respectively; and the at least one first red light emitting diode and the at least one second red light emitting diode are located on diagonal lines of the first quadrangular arrangement and the second quadrangular arrangement, respectively.

In some embodiments, when viewed from the top, the first quadrangular arrangement and the second quadrangular arrangement are mirror images of each other that are reversed on the left and the right.

In some embodiments, the first arrangement and the second arrangement are a first triangular arrangement and a second triangular arrangement, respectively.

In some embodiments, the second triangular arrangement is the first triangular arrangement rotated at 40° to 80° along a direction perpendicular to the substrate.

In some embodiments, the area of the at least one first red light emitting diode on the substrate is greater than the area of each of the first green light emitting diode and the first blue light emitting diode on the substrate, and the area of the at least one second red light emitting diode on the substrate is greater than the area of each of the second green light emitting diode and the second blue light emitting diode on the substrate.

In some embodiments, the at least one first red light emitting diode, the second green light emitting diode and the second blue light emitting diode are arranged on the substrate along a first direction, and the at least one second red light emitting diode, the first green light emitting diode and the first blue light emitting diode are arranged on the substrate along a second direction different from and parallel to the first direction.

In some embodiments, the number of the at least one first light emitting structure is plural, and the at least one first light emitting structure is arranged on the substrate along a first direction; the number of the at least one second light emitting structure is plural, and the at least one second light emitting structure is arranged on the substrate along a second direction different from and parallel to the first direction; the first arrangement is a first rectilinear arrangement; and the second arrangement is a second rectilinear arrangement.

In some embodiments, the first rectilinear arrangement is opposite to the second rectilinear arrangement.

The present disclosure also provides a light emitting diode structure. The light emitting diode structure includes a substrate and a first light emitting structure. The first light emitting structure includes a first red light emitting diode, a first green light emitting diode, a first blue light emitting diode and a first focusing optic. The first red light emitting diode, the first green light emitting diode and the first blue light emitting diode are located on the substrate. The first focusing optic covers the first red light emitting diode, the first green light emitting diode and the first blue light emitting diode, where the first focusing optic includes a first principal portion having a first principal radius of curvature and a first secondary portion having a first secondary radius of curvature, the first secondary portion is located on the first principal portion, and the first principal radius of curvature is different from the first secondary radius of curvature.

In some embodiments, the first principal radius of curvature is greater than the first secondary radius of curvature.

In some embodiments, the first secondary portion is aligned with one of the first red light emitting diode, the first green light emitting diode and the first blue light emitting diode.

In some embodiments, the light emitting diode structure further includes a second light emitting structure next to the first light emitting structure. The second light emitting structure includes a second red light emitting diode, a second green light emitting diode, a second blue light emitting diode and a second focusing optic. The second red light emitting diode, the second green light emitting diode and the second blue light emitting diode are located on the substrate. The second focusing optic covers the second red light emitting diode, the second green light emitting diode and the second blue light emitting diode, where the second focusing optic includes a second principal portion having a second principal radius of curvature and a second secondary portion having a second secondary radius of curvature, the second secondary portion is located on the second principal portion, and the second principal radius of curvature is different from the second secondary radius of curvature.

In some embodiments, the first secondary portion deviates from the center of the first principal portion in a direction away from the second secondary portion, and the second secondary portion deviates from the center of the second principal portion in a direction away from the first secondary portion.

In some embodiments, the center of the first secondary portion is aligned with a first one of the first red light emitting diode, the first green light emitting diode and the first blue light emitting diode, and the center of the second secondary portion is aligned with a second one of the second red light emitting diode, the second green light emitting diode and the second blue light emitting diode, and a light emitting color of the first one is different from a light emitting color of the second one.

BRIEF DESCRIPTION OF THE DRAWINGS

When reading the drawings of the present disclosure, it is recommended to understand various aspects of the present disclosure from the following detailed description. It should be noted that according to industry standard practice, various feature size may not be drawn to scale. Moreover, for the sake of clarity, the various feature sizes may be increased or decreased. In order to simplify the drawings, common features and structures are illustrated in the drawings in a simple schematic manner.

DETAILED DESCRIPTION

Figure 1B:
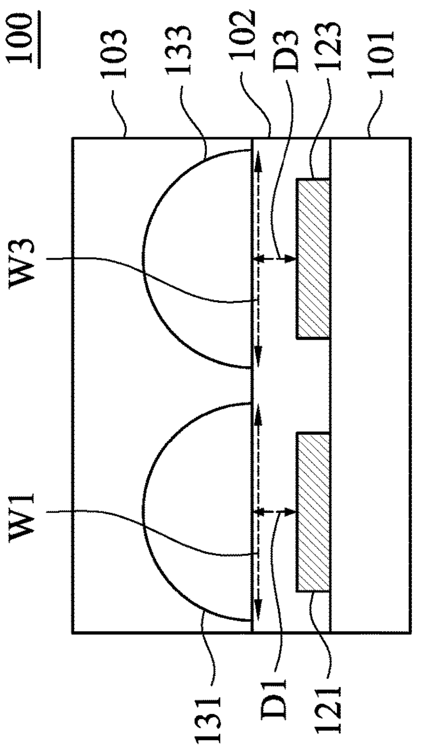
FIG. 1A and FIGS. 1B to 1C are, respectively, a top perspective view and the cross-sectional views of the light emitting diode structure according to some embodiments of the present disclosure.

To make the description of the present disclosure more detailed and complete, the following is an illustrative description of the aspects of embodiments and specific embodiments. It does not limit that the embodiments of the present disclosure are a unique form. The embodiments of the present disclosure can be combined or substituted for each other where it is beneficial, and other embodiments may be added without further description.

Spatial relative terms, such as above and below, can be used for describing the relationship between one element or feature and another element or feature in a diagram in the present disclosure. In addition to the directions depicted in the diagram, the spatial relative terms are intended to cover different directions in which an apparatus is used or operated. For example, the apparatus may be oriented in other ways (e.g., rotated 90 degrees or in other directions, etc.). Therefore, the spatial relative terms of the present disclosure can also be interpreted accordingly. In the present disclosure, unless otherwise stated, identical or similar element numbers in different diagrams refer to identical or similar elements formed from identical or similar materials through identical or similar methods.

The wordings “about”, “approximately”, “approximate”, “basically” or “substantially” used in the present disclosure include numerical values, features, and the deviation ranges of the numerical values and features that can be understood by those skilled in the art. For example, taking into account errors of the numerical values, the features, etc., the foregoing terms may indicate values within one or more standard deviations of the numerical values (e.g., a value within ±30%, ±20%, ±15%, ±10% or ±5%), or a deviation covered by the feature in practice (e.g., the statement “substantially parallel” may indicate a value that is close to parallel in practice rather than ideally perfect parallelism). In addition, the acceptable deviation range can be selected according to the measurement property or other properties, etc., and not all values and features can be applied to a deviation range.

The present disclosure provides a light emitting diode structure. The light emitting diode structure includes a substrate, and a first light emitting structure, a second light emitting structure, and a third light emitting structure that are disposed on the substrate. The first light emitting structure includes a first light emitting diode and a first focusing optic, where the first focusing optic is disposed on the first light emitting diode. The second light emitting structure includes a second light emitting diode and a second focusing optic, where the second focusing optic is disposed on the second light emitting diode. The third light emitting structure includes a third light emitting diode and a third focusing optic, where the third focusing optic is disposed on the third light emitting diode. The first light emitting structure, the second light emitting structure and the third light emitting structure are arranged along a first direction and are dislocated in a second direction perpendicular to the first direction. Next, the light emitting diode structure is described in detail according to the embodiments.

Figure 1C:
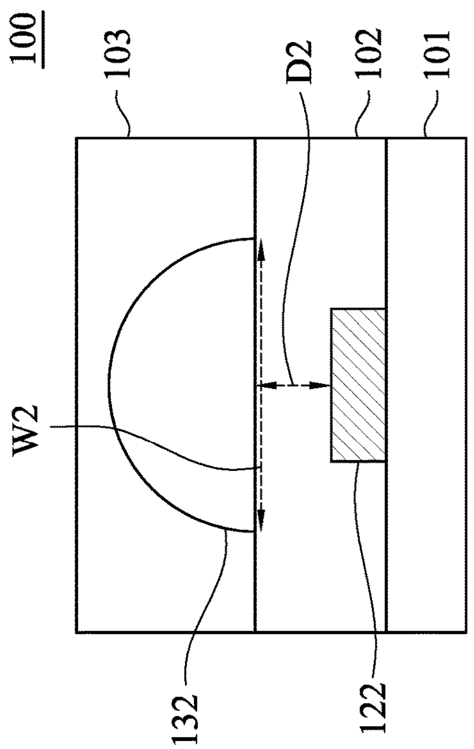
Figure 1A:
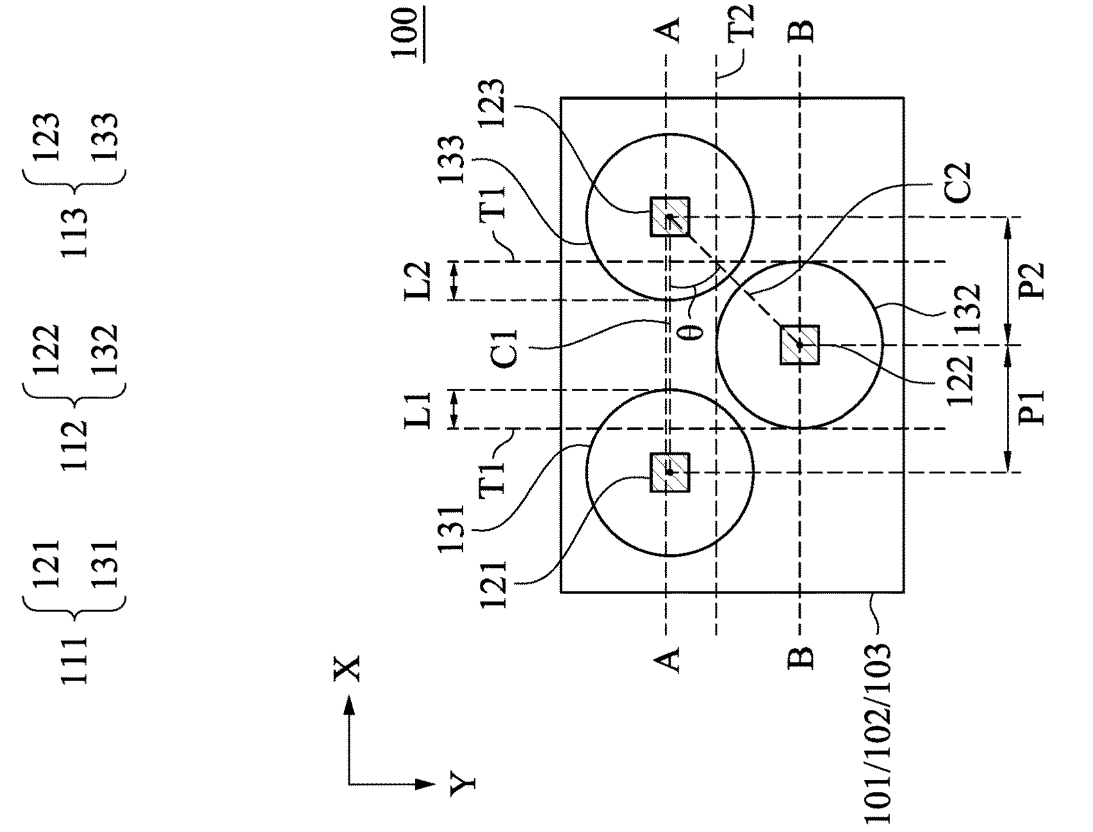

Referring to FIGS. 1A to 1C, a light emitting diode structure 100 includes a substrate 101, a first light emitting structure 111, a second light emitting structure 112 and a third light emitting structure 113, where FIGS. 1B and 1C are cross-sectional views cut from the perspective top view of FIG. 1A along line A-A and line B-B, respectively. Next, the foregoing elements are described in sequence.

First, the substrate 101 is described, and reference is made to FIGS. 1A to 1C. The substrate 101 includes a circuit that is not shown in the figures and the circuit is used for driving light emitting diodes (including a first light emitting diode 121, a second light emitting diode 122 and a third light emitting diode 123) in the first light emitting structure 111, the second light emitting structure 112 and the third light emitting structure 113 to emit light. An example of the circuit is a transistor that is switched on and off to drive the light emitting diode to emit light. In some embodiments, circuits are used, such that each of the circuits independently controls a corresponding light emitting diode to make a specific light emitting diode emit the light and make a specific light emitting diode not emit the light according to the requirement, for example, making the light emitting diode with the specific light emitting color and/or the specific light emitting angle to emit the light.

Then the first light emitting structure 111, the second light emitting structure 112 and the third light emitting structure 113 are described, and reference is made to FIGS. 1A to 1C. The first light emitting structure 111, the second light emitting structure 112 and the third light emitting structure 113 are disposed on the substrate 101 and respectively include a first light emitting diode 121, a second light emitting diode 122 and a third light emitting diode 123 for being the light sources of a display device. The first light emitting structure 111, the second light emitting structure 112 and the third light emitting structure 113 further respectively include a first focusing optic 131, a second focusing optic 132 and a third focusing optic 133 that are respectively disposed on the corresponding first light emitting diode 121, the second light emitting diode 122 and the third light emitting diode 123 to control the degree of the focusing of the light emitted from the light emitting diodes, for example, controlling the light to have different emitting angles as required. In some embodiments, as shown in FIG. 1A, the first light emitting structure 111, the second light emitting structure 112 and the third light emitting structure 113 are arranged along a first direction X and are dislocated in a second direction Y perpendicular to the first direction X, so that the first focusing optic 131, the second focusing optic 132 and the third focusing optic 133 occupy sufficient volume to control the light emitted from the light emitting diodes to the required degree of focusing, and the first light emitting diode 121, the second light emitting diode 122 and the third light emitting diode 123 are close enough to increase the display resolution. In some embodiments, the first light emitting diode 121, the second light emitting diode 122 and the third light emitting diode 123 are each micro light emitting diodes, and are each smaller than about 100 μm in size.

The first light emitting structure 111, the second light emitting structure 112 and the third light emitting structure 113 are further described, and reference is made to FIGS. 1A to 1C. In some embodiments, the second focusing optic 132 has an edge tangent T1 parallel to the second direction Y and extending through the first focusing optic 131 or the third focusing optic 133, so that the first light emitting diode 121, the second light emitting diode 122 and the third light emitting diode 123 are close enough in the first direction X on the substrate 101. In some embodiments, the second focusing optic 132 further has an edge tangent T2 parallel to the first direction X and extending through the first focusing optic 131 and/or the third focusing optic 133, so that the first light emitting diode 121, the second light emitting diode 122 and the third light emitting diode 123 are close enough in the second direction Y on the substrate 101. In some embodiments, a line connecting the center of the first light emitting structure 111 and the center of the third light emitting structure 113 is a first connecting line C1, a line connecting the center of the second light emitting structure 112 and the center of the third light emitting structure 113 is a second connecting line C2, and an angle θ between the first connecting line C1 and the second connecting line C2 is 30° to 60°, such as 30°, 35°, 40°, 45°, 50°, 55° or 60°. In some embodiments, a first pitch P1 between the center of the first light emitting structure 111 and the center of the second light emitting structure 112 in the first direction X is 20 μm to 40 μm, such as 20 μm, 30 μm, or 40 μm; and a second pitch P2 between the center of the second light emitting structure 112 and the center of the third light emitting structure 113 in the first direction X is 20 μm to 40 μm, such as 20 μm, 30 μm, or 40 μm. In some embodiments, the projections of the first light emitting structure 111 and the second light emitting structure 112 in the second direction Y have a first overlap length L1 of 0.1 μm to 10 μm, such as 0.1 μm, 0.5 μm, 1 μm, 5 μm, or 10 μm; and the projections of the second light emitting structure 112 and the third light emitting structure 113 in the second direction Y have a second overlap length L2 of 0.1 μm to 10 μm, such as 0.1 μm, 0.5 μm, 1 μm, 5 μm, or 10 μm.

The first light emitting structure 111, the second light emitting structure 112 and the third light emitting structure 113 are further described, and reference is made to FIGS. 1A to 1C. In some embodiments, the area of the first focusing optic 131, the area of the second focusing optic 132, and the area of the third focusing optic 133 on the substrate 101 respectively completely covers or is larger than the area of the first light emitting diode 121, the area of the second light emitting diode 122, and the area of the third light emitting diode 123 on the substrate 101 to effectively and predictably control the angles of the lights emitted from the light emitting diodes. In some embodiments, the center of the first focusing optic 131, the center of the second focusing optic 132, and the center of the third focusing optic 133 are respectively aligned with the center of the first light emitting diode 121, the center of the second light emitting diode 122, and the center of the third light emitting diode 123 to effectively and predictably control the angles of the lights emitted from the light emitting diodes.

The first light emitting structure 111, the second light emitting structure 112 and the third light emitting structure 113 are further described, and reference is made to FIGS. 1A to 1C. In some embodiments, first angles of the lights emitted from the first light emitting diode 121, the second light emitting diode 122 and the third light emitting diode 123 are adjusted by the first focusing optic 131, the second focusing optic 132 and the third focusing optic 133 to become second angles smaller than the first angles, so as to achieve the focusing effect. In some embodiments, the first focusing optic 131, the second focusing optic 132 and the third focusing optic 133 are plano-convex lenses. In some embodiments, the first focusing optic 131, the second focusing optic 132 and the third focusing optic 133 have curved surfaces protruding in a direction away from the first light emitting diode 121, the second light emitting diode 122 and the third light emitting diode 123. In some embodiments, the radii of curvature of the curved surfaces of the first focusing optic 131, the second focusing optic 132, and the third focusing optic 133 are independently 10 μm to 50 μm, such as 10 μm, 20 μm, 30 μm, 40 μm, or 50 μm. When the radius of curvature is too small, it may cause over-focusing, resulting in an error in controlling the emitting angle of the light and an unexpected displacement in the display result may occur. When the radius of curvature is too large, it may not have a significant effect on controlling the emitting angle of the light. In some embodiments, a first maximum width W1 of the first focusing optic 131 is 25 μm to 50 μm, such as 25 μm, 30 μm, 35 μm, 40 μm, 45 μm, or 50 μm; a second maximum width W2 of the second focusing optic 132 is 25 μm to 50 μm, such as 25 μm, 30 μm, 35 μm, 40 μm, 45 μm, or 50 μm; and a third maximum width W3 of the third focusing optic 133 is 25 μm to 50 μm, e.g., 25 μm, 30 μm, 35 μm, 40 μm, 45 μm, or 50 μm. When the maximum width is too small, it may make the radius of curvature of the curved surface too small, resulting in over-focusing. When the maximum width is too large, it may make the radius of curvature of the curved surface too large to have a significant effect on generating the focusing effect, and the display resolution may be reduced due to an excessive distance between the first light emitting diode 121, the second light emitting diode 122 and the third light emitting diode 123. In some embodiments, the first maximum width W1 and the second maximum width W2 are each 1.1 times to 2 times the first pitch P1, such as 1.1 times, 1.5 times or 2 times; and the second maximum width W1 and the third maximum width W3 are each 1.1 times to 2 times the second pitch P2, such as 1.1 times, 1.5 times, or 2 times.

The first light emitting structure 111, the second light emitting structure 112 and the third light emitting structure 113 are further described, and reference is made to FIGS. 1A to 1C. In some embodiments, a first distance D1 between a lower surface of the first focusing optic 131 and an upper surface of the first light emitting diode 121 is 10 μm to 150 μm, such as 10 μm, 50 μm, 100 μm or 150 μm; a second distance D2 between a lower surface of the second focusing optic 132 and an upper surface of the second light emitting diode 122 is 10 μm to 150 μm, such as 10 μm, 50 μm, 100 μm or 150 μm; and a third distance D3 between a lower surface of the third focusing optic 133 and an upper surface of the third light emitting diode 123 is 10 μm to 150 μm, such as 10 μm, 50 μm, 100 μm, or 150 μm. When the distance is too small, it may cause an error in controlling the lights emitted from the first focusing optic 131, the second focusing optic 132 and the third focusing optic 133, and an unexpected displacement in the display result may occur. When the distance is too large, it may not have a significant effect on adjusting the emitted angle of the light. In some embodiments, a ratio of the first distance D1 to the radius of curvature of the first focusing optic 131 is preferably 0.1 to 4, such as 0.1, 0.5, 1, 2, 3 or 4; a ratio of the second distance D2 to the radius of curvature of the second focusing optic 132 is preferably 0.1 to 4, such as 0.1, 0.5, 1, 2, 3 or 4; and a ratio of the third distance D3 to the radius of curvature of the third focusing optic 133 is preferably 0.1 to 4, such as 0.1, 0.5, 1, 2, 3 or 4.

The first light emitting structure 111, the second light emitting structure 112 and the third light emitting structure 113 are further described, and reference is made to FIGS. 1A to 1C. In some embodiments, the first light emitting diode 121, the second light emitting diode 122 and the third light emitting diode 123 are selected from the group consisting of a red light emitting diode, a green light emitting diode and a blue light emitting diode. In some embodiments, the light emitting colors of the first light emitting diode 121, the second light emitting diode 122 and the third light emitting diode 123 are different, for example, the first light emitting diode 121 emits red light, the second light emitting diode 122 emits green light and the third light emitting diode 123 emits blue light, so that the emitting angles of the red light, the green light and the blue light may be controlled by the first focusing optic 131, the second focusing optic 132 and the third focusing optic 133 to obtain different colors of expected emitting angles and resolution.

In some embodiments, the light emitting diode structure 100 further includes a transparent layer 102, and reference is made to FIGS. 1A to 1C. The transparent layer 102 is located between the first light emitting diode 121, the second light emitting diode 122 and the third light emitting diode 123 and the first focusing optic 131, the second focusing optic 132 and the third focusing optic 133 to act as a medium for light transmission. In some embodiments, the refractive index of the transparent layer 102 is smaller than the refractive indexes of the first focusing optic 131, the second focusing optic 132 and the third focusing optic 133 to increase the incident amount of the light into the first focusing optic 131, the second focusing optic 132 and the third focusing optic 133.

In some embodiments, the light emitting diode structure 100 further includes a protective layer 103, and reference is made to FIGS. 1A to 1C. The protective layer 103 is located on the first focusing optic 131, the second focusing optic 132 and the third focusing optic 133 to act as a protective structure for the elements thereunder and to provide a flat surface for the elements thereon. In some embodiments, the refractive index of the protective layer 103 is smaller than the refractive indexes of the first focusing optic 131, the second focusing optic 132 and the third focusing optic 133 to increase the amount of the light emitted from the first focusing optic 131, the second focusing optic 132 and the third focusing optic 133.

The present disclosure also provides a light emitting diode structure. The light emitting diode structure includes a substrate and at least one first light emitting structure. The at least one first light emitting structure includes at least one first red light emitting diode, a first green light emitting diode, a first blue light emitting diode and a first focusing optic. The at least one first red light emitting diode, the first green light emitting diode and the first blue light emitting diode are located on the substrate. The first focusing optic completely covers the at least one first red light emitting diode, the first green light emitting diode and the first blue light emitting diode. Next, the light emitting diode structure is described in detail according to the embodiments.

Figure 2B:
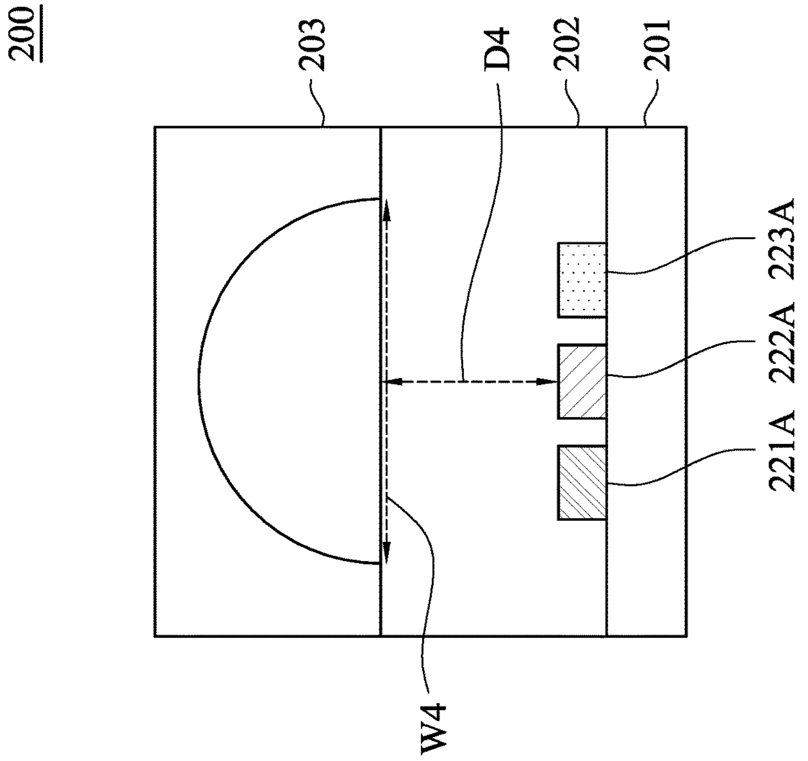
FIGS. 2A and 2B are, respectively, a top perspective view and a cross-sectional view of the light emitting diode structure according to some other embodiments of the present disclosure.
Figure 2A:
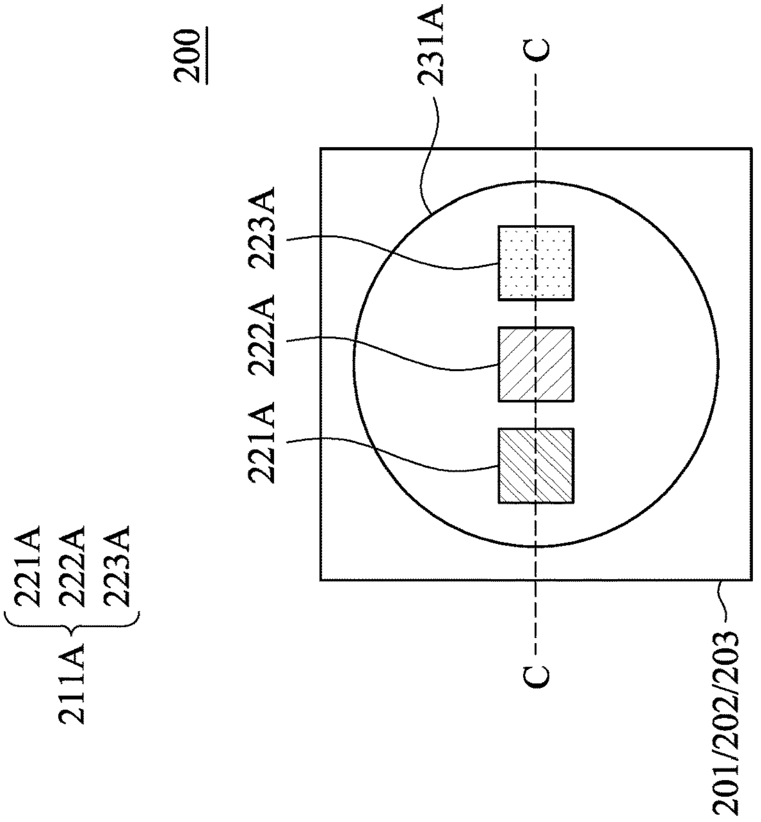

Referring to FIGS. 2A to 7, a light emitting diode structure 200 includes a substrate 201 and at least one first light emitting structure 211A, where FIG. 2B is a cross-sectional view cut from the perspective top view of FIG. 2A along a line C-C, and FIGS. 3A to 3B, FIGS. 4A to 4B, FIG. 5 and FIG. 6 are top perspective views according to the first embodiment, the second embodiment, the third embodiment and the fourth embodiment, respectively. Next, the foregoing elements are described in sequence.

First, the substrate 201 is described, and reference is made to FIGS. 2A to 6. The substrate 201 is basically the same as the substrate 101 described above, and includes a circuit that is not shown in the figures and used for driving the light emitting diodes to emit light, except that the circuit of the substrate 201 drives the light emitting diodes (including at least one first red light emitting diode 221A, a first green light emitting diode 222A and a first blue light emitting diode 223A) in the at least one first light emitting structure 211A and the light emitting diodes (including at least one second red light emitting diode 221B, a second green light emitting diode 222B and a second blue light emitting diode 223B) in the at least one second light emitting structure 211B described below to emit light. In addition, the features of the substrate 201 and the features related to the light emitting diodes can be referred to above and will not be repeated herein.

Then the at least one first light emitting structure 211A is described, and reference is made to FIGS. 2A to 6. The at least one first light emitting structure 211A includes at least one first red light emitting diode 221A, a first green light emitting diode 222A and a first blue light emitting diode 223A that are arranged on the substrate 201 to act as light sources for displaying different colors of light. The at least one first light emitting structure 211A also includes a single first focusing optic 231A continuously and completely covering the at least one first red light emitting diode 221A, the first green light emitting diode 222A and the first blue light emitting diode 223A to effectively and predictably control the degree of the focusing of the light emitted from the light emitting diodes, for example, controlling the emitting angle of the light as required. In some embodiments, the area of the first focusing optic 231A on the substrate 201 is greater than the area of the at least one first red light emitting diode 221A, the first green light emitting diode 222A and the first blue light emitting diode 223A on the substrate 201. In some embodiments, the center of the first focusing optic 231A is aligned with the geometric center of the at least one first red light emitting diode 221A, the first green light emitting diode 222A and the first blue light emitting diode 223A. In some embodiments, the at least one first red light emitting diode 221A, the first green light emitting diode 222A and the first blue light emitting diode 223A are micro light emitting diodes and smaller than about 100 μm in size. It should be noted that the arrangement and the numbers of the at least one first red light emitting diode 221A, the first green light emitting diode 222A and the first blue light emitting diode 223A are not limited to the arrangement of a linear shape and the number of one for each light emitting diode shown in FIGS. 2A and 2B, and may be the shapes and the numbers shown in the first embodiment, the second embodiment, the third embodiment and the fourth embodiment described in detail below.

The at least one first light emitting structure 211A is further described, and reference is made to FIGS. 2A to 6. In some embodiments, first angles of lights emitted from the at least one first red light emitting diode 221A, the first green light emitting diode 222A and the first blue light emitting diode 223A are adjusted by the first focusing optic 231A to form second angles smaller than the first angles, so as to achieve the focusing effect. In some embodiments, the first focusing optic 231A is a plano-convex lens. In some embodiments, the first focusing optic 231A has a curved surface protruding in a direction away from the at least one first red light emitting diode 221A, the first green light emitting diode 222A and the first blue light emitting diode 223A. In some embodiments, a radius of curvature of the curved surface of the first focusing optic 231A is 30 μm to 60 μm, such as 30 μm, 35 μm, 40 μm, 45 μm, 50 μm, 55 μm, or 60 μm. When the radius of curvature is too small, it may cause over-focusing, resulting in an error in controlling the emitting angle of the light, and an unexpected displacement in the display result may occur. When the radius of curvature is too large, it may not have a significant effect on controlling the emitting angle of the light. In some embodiments, a maximum width W4 of the first focusing optic 231A is 50 μm to 100 μm, such as 50 μm, 60 μm, 70 μm, 80 μm, 90 μm, or 100 μm. When the maximum width is too small, it may make the radius of curvature of the curved surface too small, resulting in the over-focusing. When the maximum width is too large, it may make the radius of curvature of the curved surface too large, and does not have a significant effect on focusing the light.

The at least one first light emitting structure 211A is further described, and reference is made to FIGS. 2A to 6. In some embodiments, a distance D4 between a lower surface of the first focusing optic 231A and upper surfaces of the at least one first red light emitting diode 221A, the first green light emitting diode 222A and the first blue light emitting diode 223A is 10 μm to 150 μm, such as 10 μm, 30 μm, 50 μm, 70 μm, 90 μm, 110 μm, 130 μm, or 150 μm.

When the distance is too small, it may make an error in controlling the emitting angle of the light emitted from the first focusing optic 231A, and an unexpected displacement in the display result may occur. When the distance is too large, it may not have a significant effect on adjusting the emitting angle of the light.

In some embodiments, the light emitting diode structure 200 further includes a transparent layer 202, and reference is made to FIGS. 2A to 6. The features of the transparent layer 202 and the features related to the at least one first red light emitting diode 221A, the first green light emitting diode 222A, the first blue light emitting diode 223A and the first focusing optic 231A are basically the same as those of the transparent layer 102 and the features related to the first light emitting diode 121, the second light emitting diode 122, the third light emitting diode 123, the first focusing optic 131, the second focusing optic 132 and the third focusing optic 133. Therefore, the details can be referred to the above, and will not be repeated herein.

In some embodiments, the light emitting diode structure 200 further includes a protective layer 203, and reference is made to FIGS. 2A to 6. The features of the protective layer 203 and the features related to the first focusing optic 231A are basically the same as those of the protective layer 103 and the features related to the first focusing optic 131, the second focusing optic 132 and the third focusing optic 133 above. Therefore, the details can be referred to the above, and will not be repeated herein.

Next, possible variations of the light emitting diode structure 200 are illustrated with detailed embodiments. Unless further specified, the features above are applied to the following variations, and therefore the related features can be referred to above and will not be repeated below.

Figure 7:
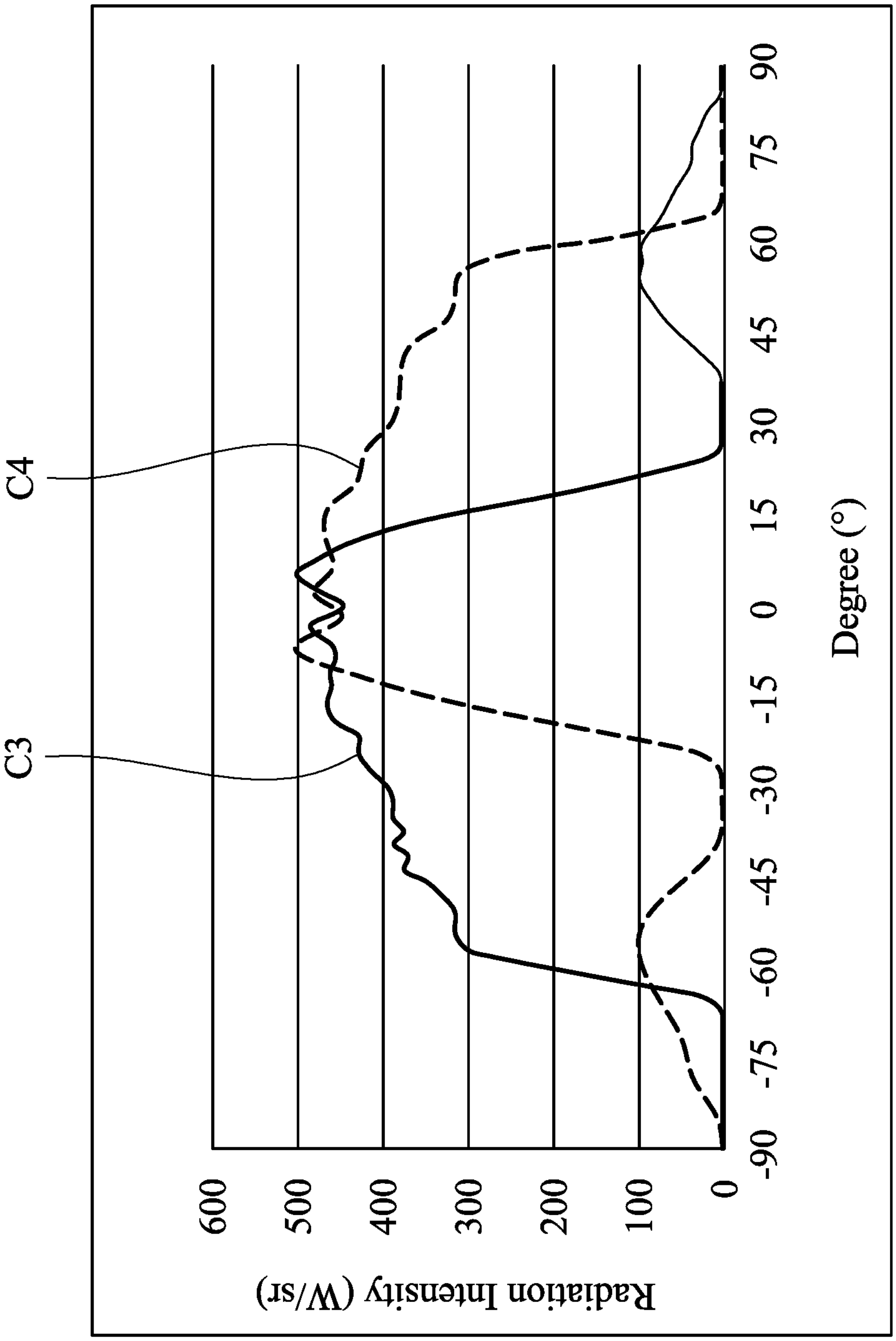
FIG. 7 is a diagram of a relationship between the radiation angle and the radiation intensity of the light emitting from the light emitting diode structure according to some embodiments of the present disclosure.

In the first embodiment (referring to FIGS. 3A and 3B), an arrangement of the at least one first red light emitting diode 221A, the first green light emitting diode 222A and the first blue light emitting diode 223A is a quadrangular arrangement, so as to effectively gather the light emitting diodes together to improve the display resolution, and avoid the problems of generating an error in controlling the emitting angle of the light and/or the problems of the emitting the light shifted from the center of the first focusing optic 231A due to the fact that the light emitting diodes are too close to the edge of the first focusing optic 231A (for example, in FIG. 7, the emitting angle of the light is shifted and forms an asymmetrical radiation, which will be described in detail later). That is, the quadrangular arrangement can improve the display resolution and avoids the display displacement. In some embodiments, the number of the at least one first red light emitting diode 221A is plural (e.g., two as shown in the figure), the at least one first red light emitting diode 221A is located on a diagonal line of the quadrangular arrangement, and the first green light emitting diode 222A and the first blue light emitting diode 223A are located on another diagonal line of the quadrangular arrangement to avoid the problems of Line Mura and the like due to the fact that the at least one first red light emitting diode 221A is too close to each other in the quadrangular arrangement. In some embodiments, when viewed from the top, a first total area of the at least one first red light emitting diode 221A is greater than a second total area of the first green light emitting diode 222A and a third total area of the first blue light emitting diode 223A, so as to increase the output of the light from the red light emitting diode which has relatively poor efficiency in generating the red light, so the display quality can be improved. In some embodiments, the first total area is preferably 1.5 to 4 times the second total area (or the third total area), such as 1.5 times, 2 times, 3 times or 4 times, etc.

Figure 4A:
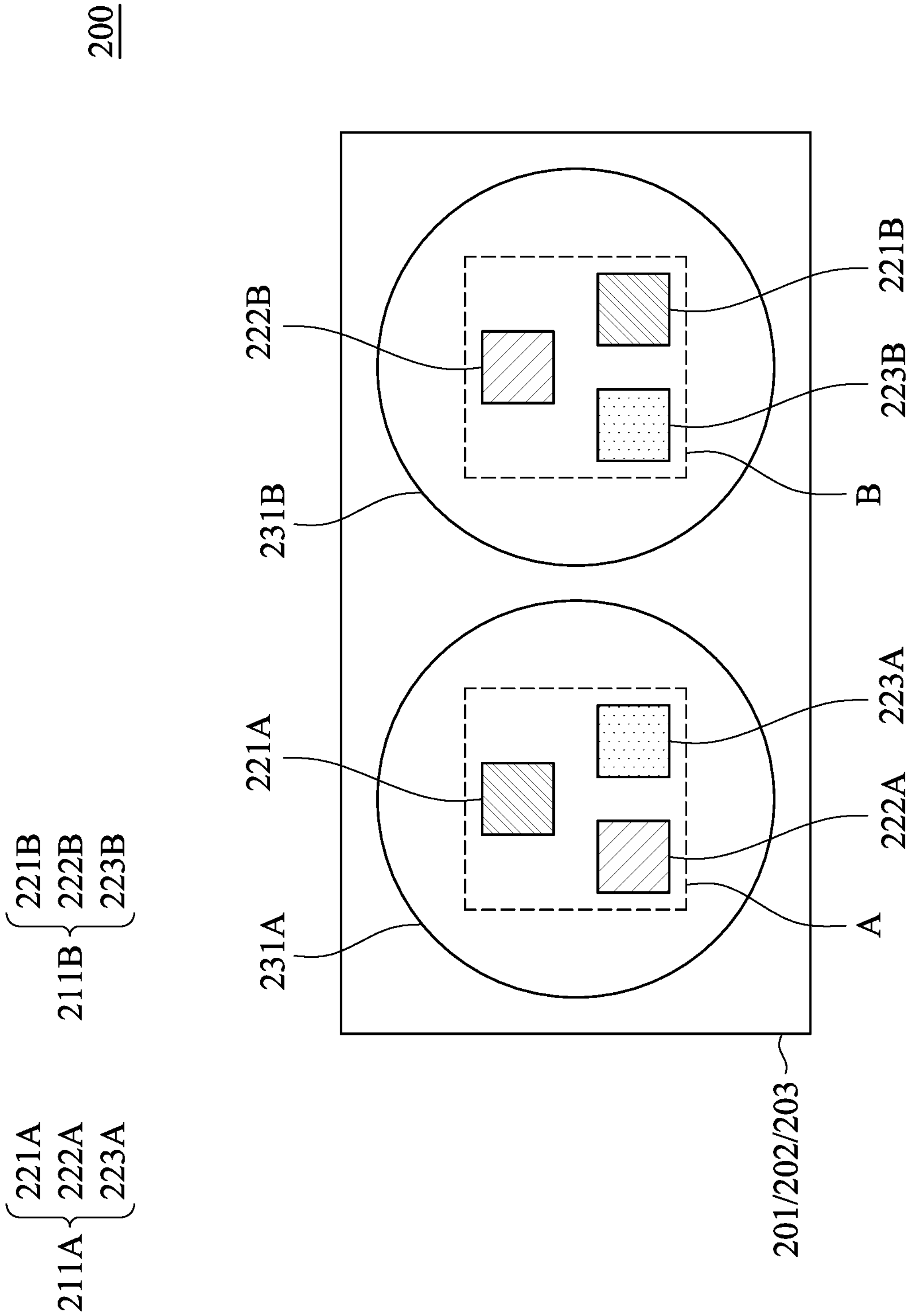
Figure 4B:
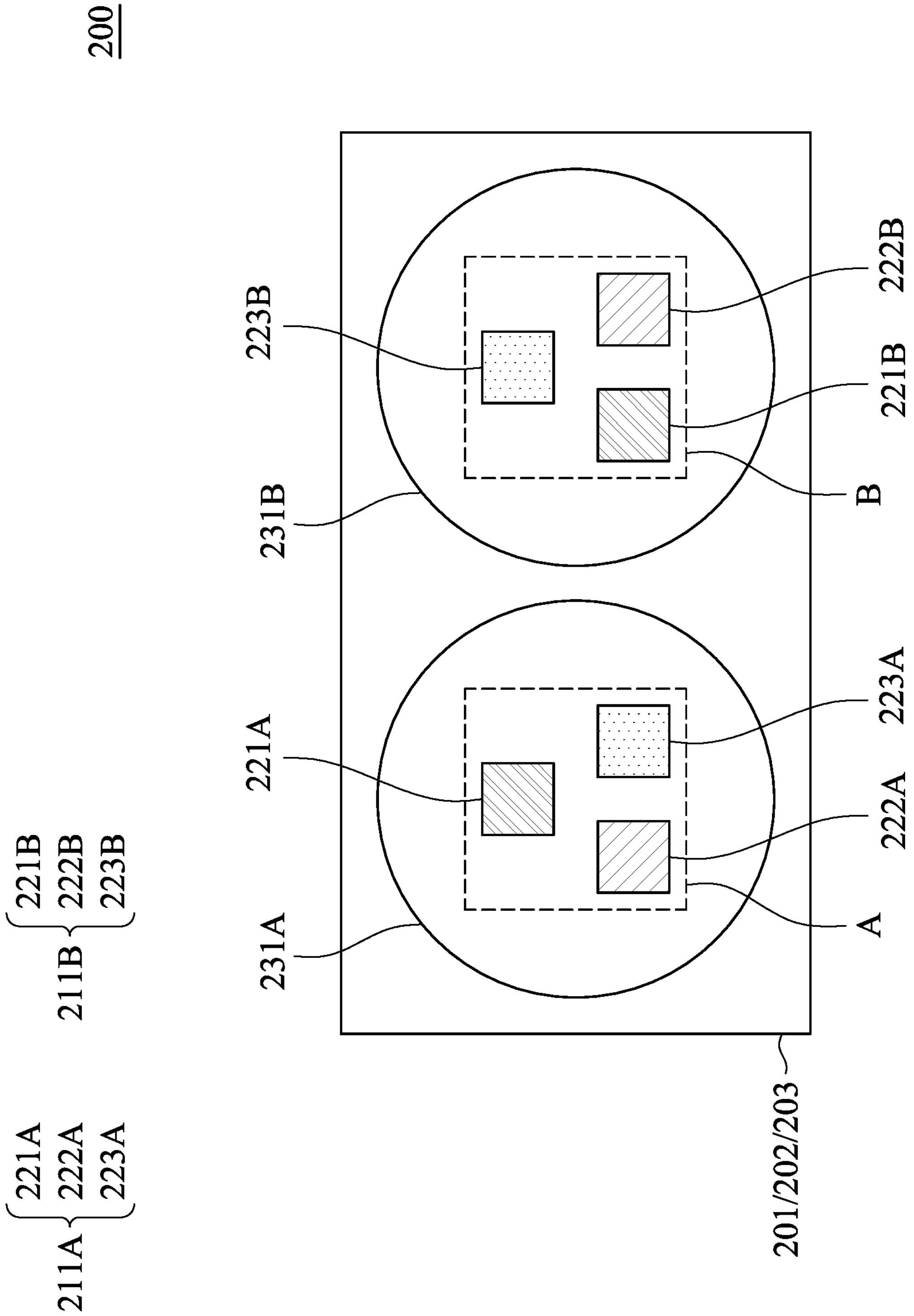
Figure 5:
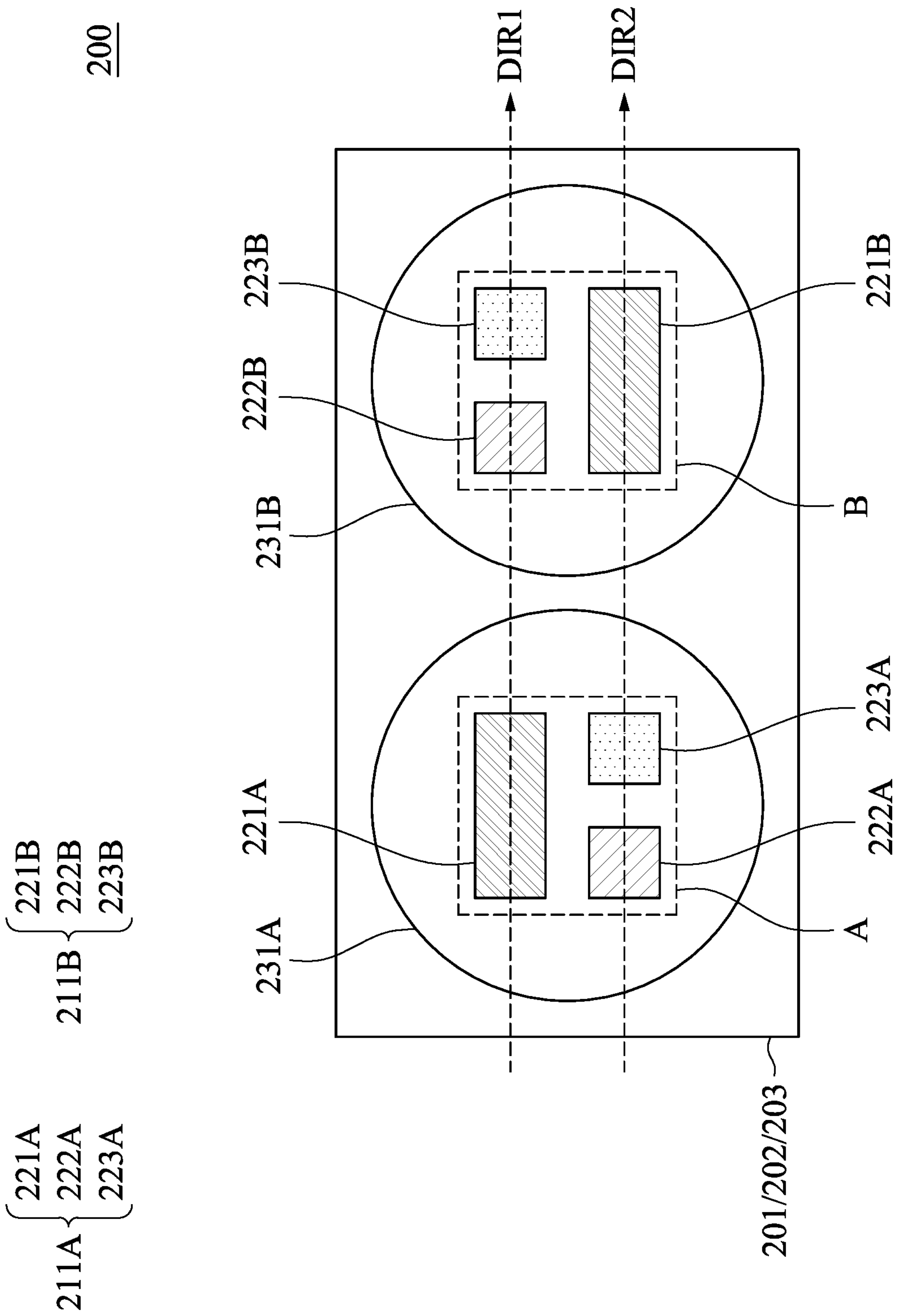

In the second embodiment (referring to FIGS. 4A and 4B), the arrangement of the at least one first red light emitting diode 221A, the first green light emitting diode 222A and the first blue light emitting diode 223A is a triangular arrangement, so as to effectively gather the light emitting diodes together, as described in the first embodiment, thereby improving the display resolution and avoiding the display displacement, etc. Details are described as above, and will not be repeated herein. In some embodiments, the number of the at least one first red light emitting diode 221A is plural, or may be one as shown in FIGS. 4A and 4B.

In the third embodiment (referring to FIG. 5), the arrangement of the at least one first red light emitting diode 221A, the first green light emitting diode 222A and the first blue light emitting diode 223A is a triangular arrangement (based on the geometric centers of the at least one first red light emitting diode 221A, the first green light emitting diode 222A and the first blue light emitting diode 223A being the references for determining the type of the arrangement), so as to effectively gather the light emitting diodes together, as described in the first embodiment, thereby increasing the display resolution and avoiding the display displacement, etc. In some embodiments, when viewed from the top, a first total area of the at least one first red light emitting diode 221A is greater than a second total area of the first green light emitting diode 222A and a third total area of the first blue light emitting diode 223A, so as to increase the output of the light from the red light emitting diode which has relatively poor efficiency in generating the red light, so the display quality can be improved. In some embodiments, the first total area is preferably 1.5 to 4 times the second total area (or the third total area), such as 1.5 times, 2 times, 3 times or 4 times, etc. In some embodiments, the at least one first red light emitting diode 221A is a single and continuous entity.

Figure 6:
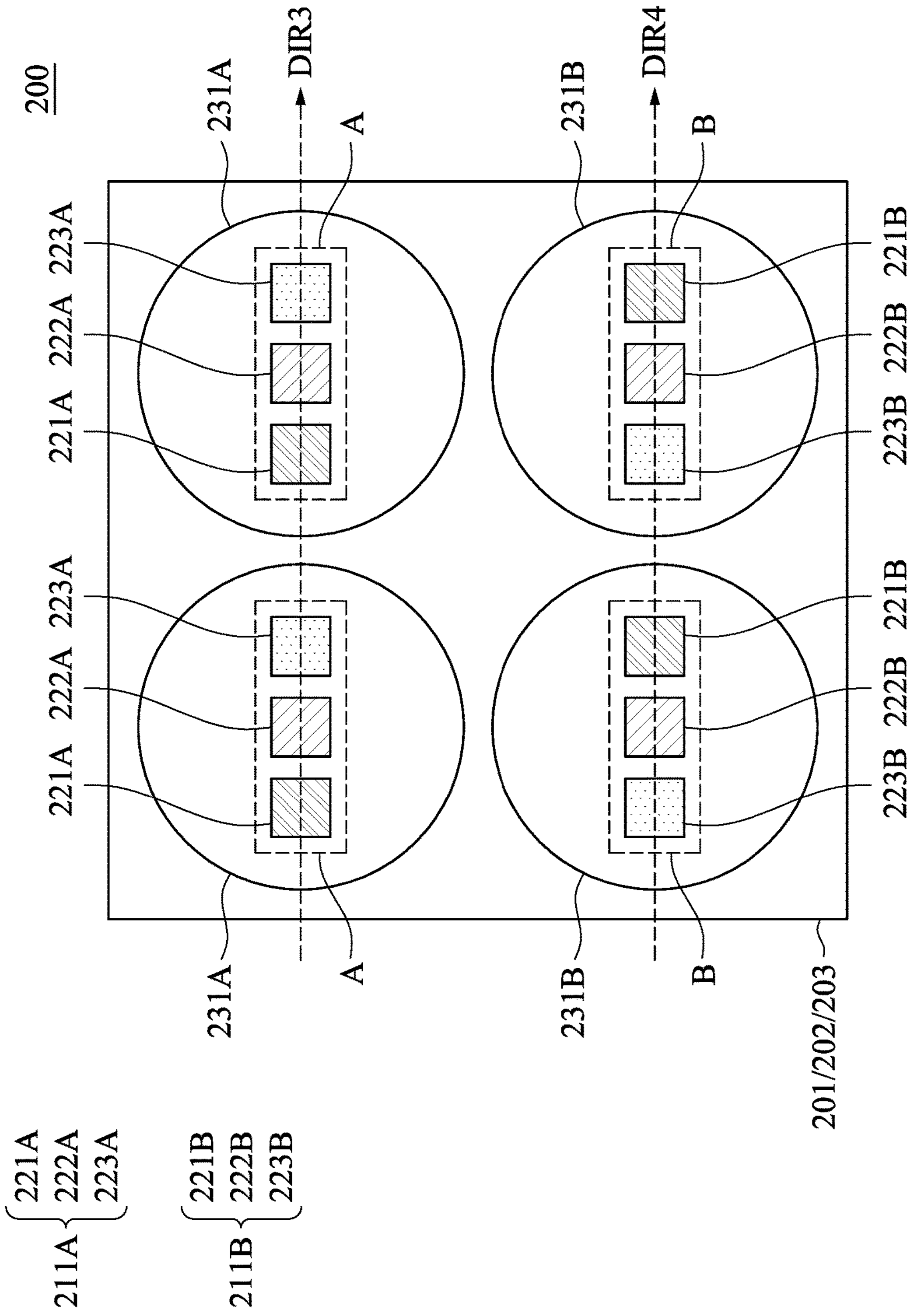

In the fourth embodiment (referring to FIG. 6), the arrangement of the at least one first red light emitting diode 221A, the first green light emitting diode 222A and the first blue light emitting diode 223A is a rectilinear arrangement to simplify the manufacturing process for an easier implementation. In some embodiments, the number of the at least one first red light emitting diode 221A is plural, or may be one as shown in FIG. 6.

In some embodiments, reference is made to FIGS. 3A to 6. The light emitting diode structure 200 further includes at least one second light emitting structure 211B next to the at least one first light emitting structure 211A. The at least one second light emitting structure 211B is basically the same as the at least one first light emitting structure 211A, including, for example, at least one second red light emitting diode 221B, a second green light emitting diode 222B, a second blue light emitting diode 223B and a second focusing optic 231B corresponding to the at least one first red light emitting diode 221A, the first green light emitting diode 222A, the first blue light emitting diode 223A and the first focusing optic 231A, respectively. Therefore, the details can be referred to the above, and will not be repeated herein. However, a first arrangement A of the at least one first red light emitting diode 221A, the first green light emitting diode 222A and the first blue light emitting diode 223A may be the same as (e.g., with reference to FIG. 3A) or different from (e.g., with reference to FIGS. 3B to 6) a second arrangement B of the at least one second red light emitting diode 221B, the second green light emitting diode 222B and the second blue light emitting diode 223B. The adjacent at least one first light emitting structure 211A and at least one second light emitting structure 211B compensate for each other's shortcomings through the arrangements of the light emitting diodes thereof, for example, compensating for the difference in the efficiency of outputting the light and/or compensating for the displacement in the emitting angle of the light as shown in FIG. 7, so that the display quality is further improved, such as avoiding the display displacement, improving the display resolution, and improving the display uniformity. Next, the first arrangement A and the second arrangement B are described in detail with reference to the first embodiment, the second embodiment, the third embodiment, and the fourth embodiment.

Figure 3A:
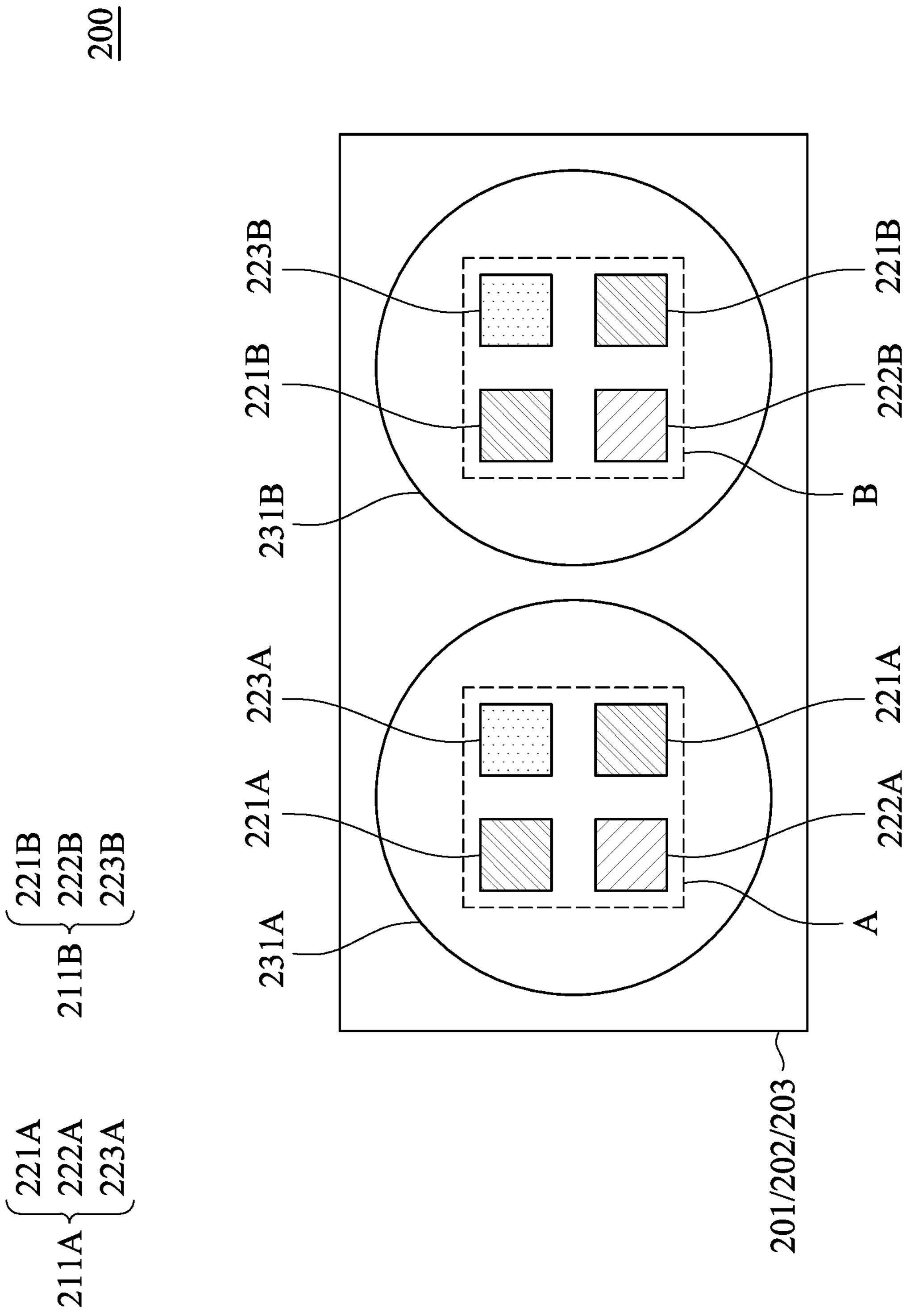
FIGS. 3A to 3B, FIGS. 4A to 4B, FIG. 5 and FIG. 6 are top perspective views of the light emitting diode structure according to the first embodiment, the second embodiment, the third embodiment and the fourth embodiment of the present disclosure, respectively.
Figure 3B:
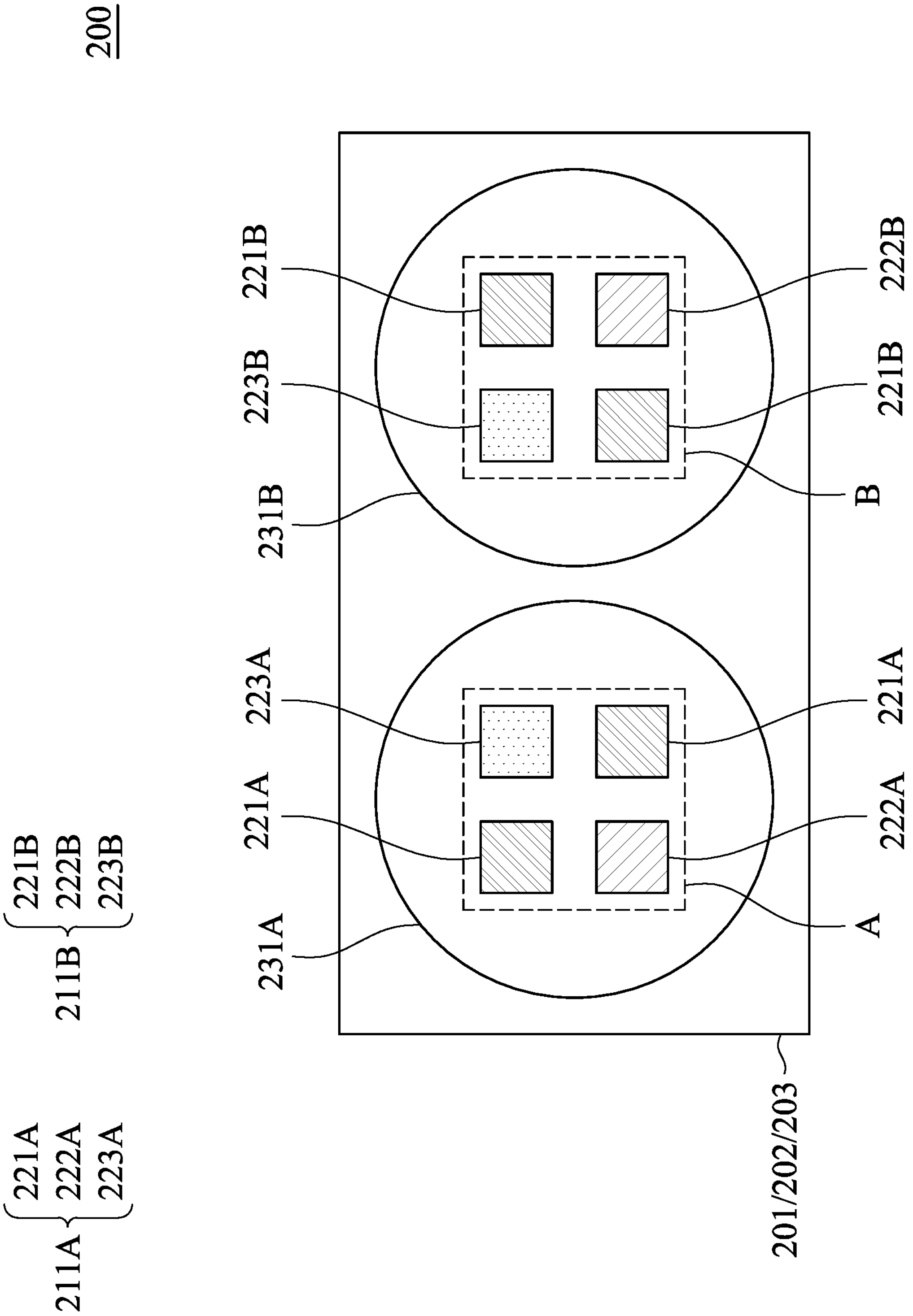

In the first embodiment (referring to FIGS. 3A and 3B), the preferable first arrangement A and the second arrangement B are a first quadrangular arrangement and a second quadrangular arrangement, respectively, where the first quadrangular arrangement and the second quadrangular arrangement are substantially the same (as shown in FIG. 3A), or the first quadrangular arrangement and the second quadrangular arrangement are mirror images with each other that are reversed on the left and the right in the top view (as shown in FIG. 3B).

In the second embodiment (referring to FIGS. 4A and 4B), the preferable first arrangement A is different from the second arrangement B, where the first arrangement A is a first triangular arrangement, the second arrangement B is a second triangular arrangement, and the second triangular arrangement is the first triangular arrangement rotated clockwise (as shown in FIG. 4A) or counterclockwise (as shown in FIG. 4B) from 40° to 80°, such as 40°, 50°, 60°, 70° or 80°, in which 50° to 70° is more preferable, along the direction perpendicular to the substrate.

In the third embodiment (referring to FIG. 5), the preferable first arrangement A is different from the second arrangement B, where the at least one first red light emitting diode 221A, the second green light emitting diode 222B and the second blue light emitting diode 223B are arranged on the substrate 201 along a first direction DIR1, and the at least one second red light emitting diode 221B, the first green light emitting diode 222A and the first blue light emitting diode 223A are arranged on the substrate along a second direction DIR2 different from the first direction DIR1 but parallel to the first direction DIR1. Therefore, the at least one first red light emitting diode 221A and the at least one second red light emitting diode 221B are not located on the same extension line, thus avoiding the problem of Line Mura.

In the fourth embodiment (referring to FIG. 6), the preferable first arrangement A is different from the second arrangement B, the at least one first light emitting structure 211A is plural and repeatedly arranged on the substrate 201 along a first direction DIR3, and the at least one second light emitting structure 211B is plural and repeatedly arranged on the substrate 201 along a second direction DIR4 that is different from the first direction DIR3 and parallel to the first direction DIR3, where the first arrangement A is a first rectilinear arrangement, the second arrangement B is a second rectilinear arrangement, and the first rectilinear arrangement is opposite or reverse to the second rectilinear arrangement. Therefore, a adjacent pair of the light emitting diodes in the at least one first light emitting structure 211A located below different first focusing optics 231A (e.g., the pair including the first blue light emitting diode 223A on the left and the at least one first red light emitting diode 221A on the right in the figure) and a adjacent pair of the light emitting diodes in the at least one second light emitting structure 211B located below different second focusing optics 231B (e.g., the pair including the at least one second red light emitting diode 221B on the left and the second blue light emitting diode 223B on the right in the figure) can compensate for the deficiency in emitting the light with each other in the pair. For example, with reference to FIG. 7, since the adjacent pair of the light emitting diodes is located at the edges of the first focusing optics 231A or the second focusing optics 231B, the emitting angles of the pair of the light emitting diodes shift from the center of the emitting angle (equivalent to the position of 0°), which are shown as the curve C3 and the curve C4 having asymmetrical distributions and reversed to each other in FIG. 7. Therefore, when the light emitting diodes are arranged as shown in FIG. 6, the asymmetrical curve C3 and curve C4 can superimpose with each other to form a symmetrical distribution that improves the display displacement. In addition, the display uniformity can be improved by making the first rectilinear arrangement opposite to the second rectilinear arrangement.

The present disclosure also provides a light emitting diode structure. The light emitting diode structure includes a substrate and a first light emitting structure. The first light emitting structure includes a first red light emitting diode, a first green light emitting diode, a first blue light emitting diode and a first focusing optic. The first red light emitting diode, the first green light emitting diode and the first blue light emitting diode are located on the substrate. The first focusing optic covers the first red light emitting diode, the first green light emitting diode and the first blue light emitting diode, where the first focusing optic includes a first principal portion having a first principal radius of curvature and a first secondary portion having a first secondary radius of curvature, and the first principal radius of curvature is different from the first secondary radius of curvature. Next, the light emitting diode structure is described in detail according to the embodiments.

Figure 8:
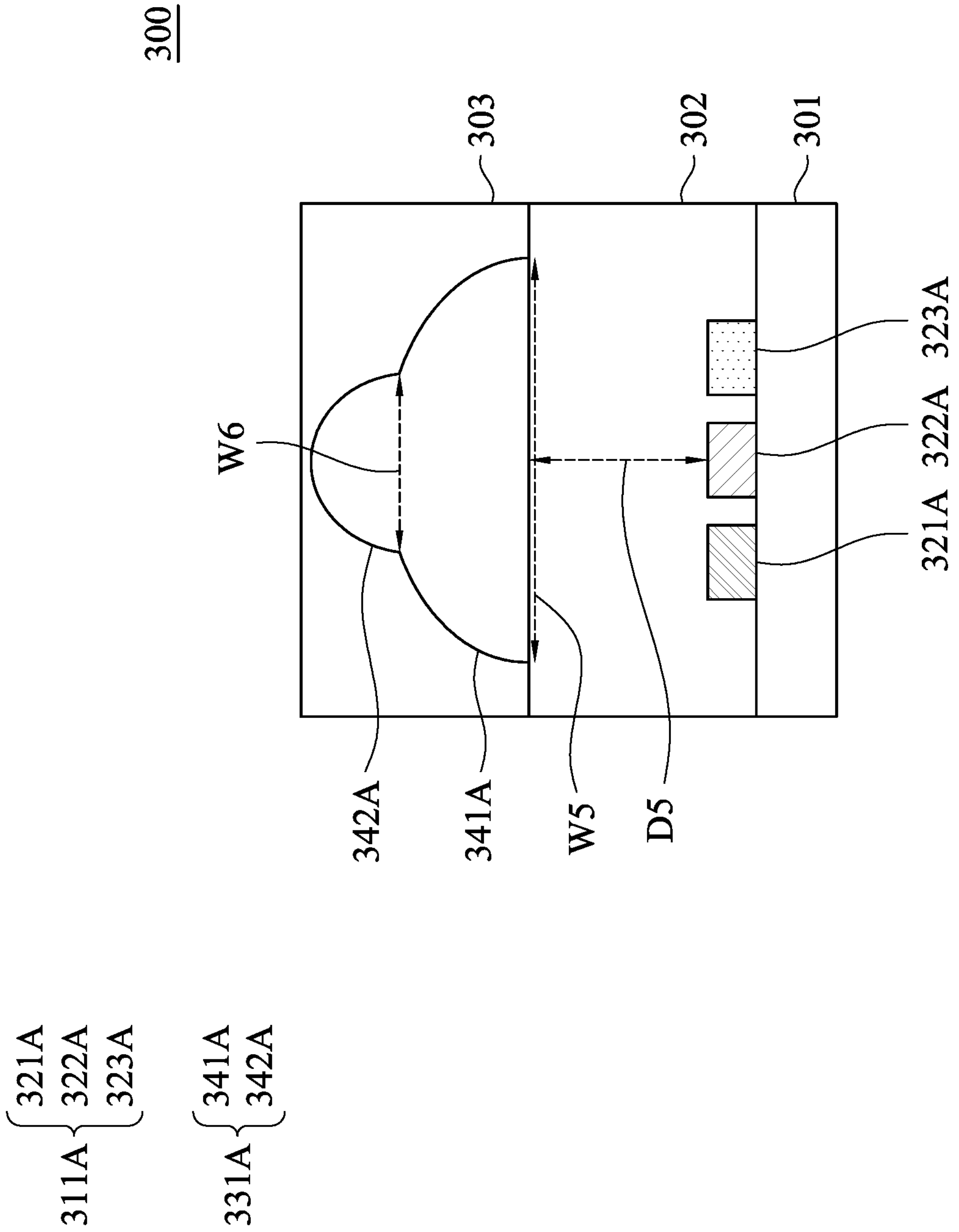
FIGS. 8 and 9 are cross-sectional views of the light emitting diode structure according to some other embodiments of the present disclosure.
Figure 9:
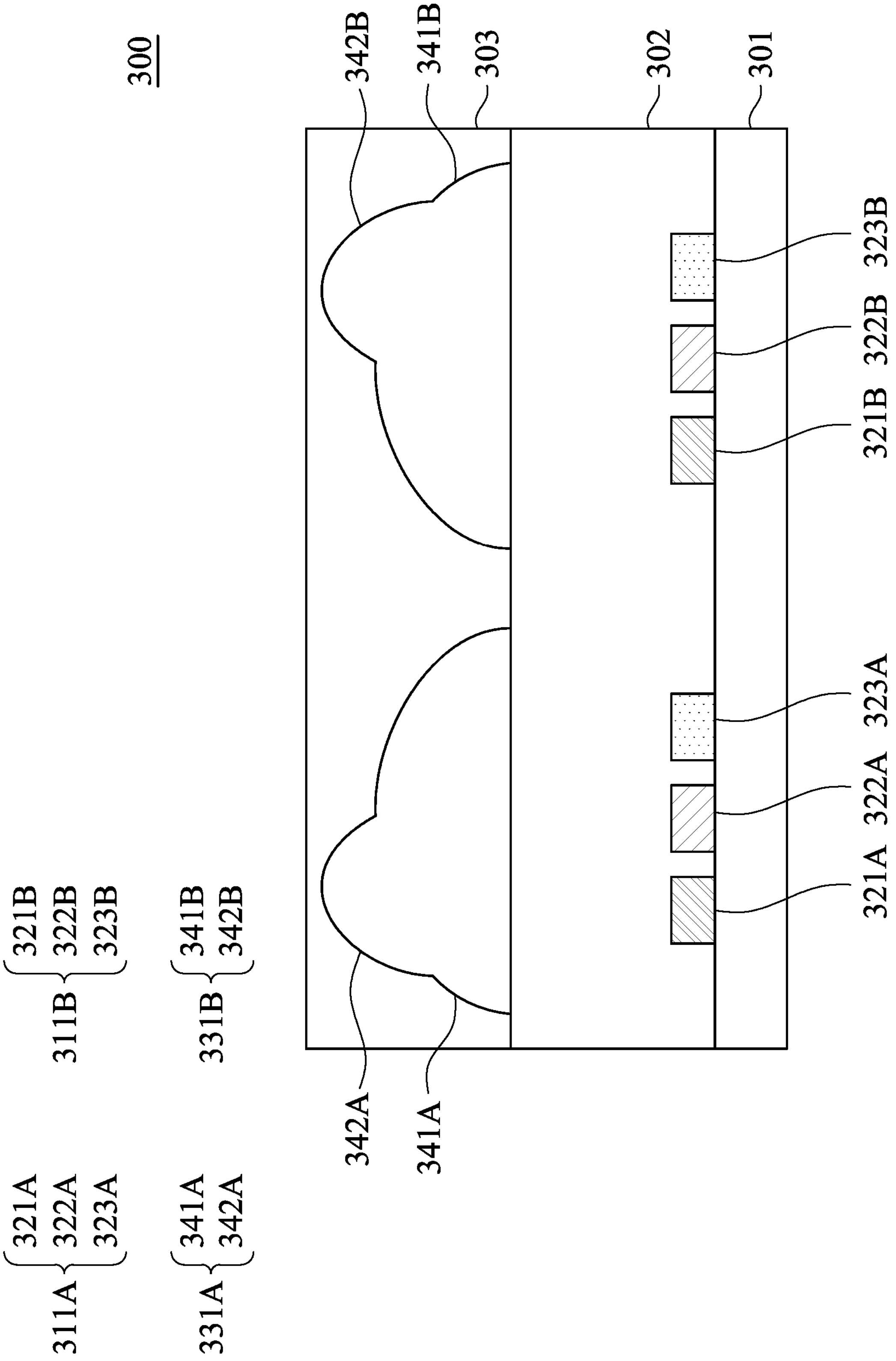

Referring to FIGS. 8 and 9, the light emitting diode structure 300 includes a substrate 301 and a first light emitting structure 311A. The foregoing elements are then described in sequence.

First, the substrate 301 is described, and reference is made to FIGS. 8 and 9. The substrate 301 is basically the same as the substrate 101 described above, and includes a circuit that is not shown in the figures and used for driving the light emitting diodes to emit light, except that the circuit of the substrate 301 drives the light emitting diodes (including a first red light emitting diode 321A, a first green light emitting diode 322A and a first blue light emitting diode 323A) in the first light emitting structure 311A and the light emitting diodes (including a second red light emitting diode 321B, a second green light emitting diode 322B and a second blue light emitting diode 323B) in the second light emitting structure 311B described below to emit light. In addition, the features of the substrate 301 and the features related to the light emitting diodes can be referred to above and will not be repeated herein.

Then the first light emitting structure 311A is described, and reference can be made to FIGS. 8 and 9. The first light emitting structure 311A includes a first red light emitting diode 321A, a first green light emitting diode 322A and a first blue light emitting diode 323A that are arranged on the substrate 201 as the light sources for displaying different colors of light. The first light emitting structure 311A also includes a single first focusing optic 331A continuously and completely covering the first red light emitting diode 321A, the first green light emitting diode 322A and the first blue light emitting diode 323A to effectively and predictably control the degree of the focusing of the light emitted from the light emitting diodes, for example, controlling the emitting angles of the light as required. In some embodiments, the area of the first focusing optic 331A on the substrate 301 is greater than the areas of the first red light emitting diode 321A, the first green light emitting diode 322A and the first blue light emitting diode 323A on the substrate 301. In some embodiments, the first red light emitting diode 321A, the first green light emitting diode 322A and the first blue light emitting diode 323A are micro light emitting diodes and smaller than about 100 μm in size. It should be noted that the arrangement and the numbers of the first red light emitting diode 321A, the first green light emitting diode 322A and the first blue light emitting diode 323A are not limited to the arrangement of being a linear shape and the number of being one for each light emitting diode as shown in FIGS. 8 and 9, and it may be the shapes and the numbers as shown in the first embodiment, the second embodiment, the third embodiment and the fourth embodiment as detailed above. That is, the first focusing optic 331A can replace the first focusing optic 231A and/or the second focusing optic 231B to be applied to the first embodiment, the second embodiment, the third embodiment and the fourth embodiment.

The first light emitting structure 311A is further described, and reference can be made to FIGS. 8 and 9. The first focusing optic 331A includes a first principal portion 341A having a first principal radius of curvature and a first secondary portion 342A located on the first principal portion 341A and having a first secondary radius of curvature, where the first principal radius of curvature is different from the first secondary radius of curvature. Therefore, more emitting angles of the light can be controlled by having the first secondary portion 342A located on different positions of the first principal portion 341A. In some embodiments, the center of the first principal portion 341A is aligned with the geometric center of the first red light emitting diode 321A, the first green light emitting diode 322A and the first blue light emitting diode 323A. In some embodiments, the center of the first secondary portion 342A is aligned with one of the first red light emitting diode 321A, the first green light emitting diode 322A and the first blue light emitting diode 323A to further control the specific one of the light emitting diodes. In some embodiments, the first secondary portion 342A is aligned with the first red light emitting diode 321A to enhance the control of the red light emitting diode that relatively has poor efficiency in generating the red light.

The first light emitting structure 311A is further described, and reference can be made to FIGS. 8 and 9. In some embodiments, the projection area of the first secondary portion 342A on the substrate 301 is smaller than the projection area of the first principal portion 341A on the substrate 301, so that the projection area of the first focusing optic 331A on the substrate 301 is substantially equal to the projection area of the first principal portion 341A on the substrate 301. Therefore, a pitch between the first light emitting structure 311A and other light emitting structures (e.g., the second light emitting structure 311B described in detail below) does not make the area occupied by the first focusing optic 331A on the surface of the substrate 301 increase by including the first secondary portion 342A that is used to further control the emitting angle of the light. That is, the pitch between the first light emitting structure 311A and other light emitting structures can be reduced to increase the display resolution, and the ability of the first focusing optic 331A to control the emitting angle of the light is also significantly improved.

The first light emitting structure 311A is further described, and reference can be made to FIGS. 8 and 9. In some embodiments, first angles of the lights emitted from the first red light emitting diode 321A, the first green light emitting diode 322A and the first blue light emitting diode 323A are adjusted by the first focusing optic 331A to become second angles smaller than the first angles, so as to achieve the focusing effect. In some embodiments, the first principal portion 341A and the first secondary portion 342A of the first focusing optic 331A are plano-convex lenses. In some embodiments, the first principal portion 341A and the first secondary portion 342A have curved surfaces protruding in a direction away from the first red light emitting diode 321A, the first green light emitting diode 322A and the first blue light emitting diode 323A. In some embodiments, the first principal radius of curvature of the first principal portion 341A is greater than the first secondary radius of curvature of the first secondary portion 342A, so that the focusing degree of the first secondary portion 342A is greater than that of the first principal portion 341A. In some embodiments, the first principal radius of curvature is 30 μm to 60 μm, such as 30 μm, 35 μm, 40 μm, 45 μm, 50 μm, 55 μm, or 60 μm, and the first secondary radius of curvature is 5 μm to 30 μm, such as 5 μm, 10 μm, 15 μm, 20 μm, 25 μm, or 30 μm. When the radius of curvature is too small, it may cause over-focusing, resulting in an error in controlling the emitting angle of the light, and an unexpected display displacement may occur. When the radius of curvature is too large, it may not have a significant effect on controlling the emitting angle of the light. In some embodiments, a maximum width W5 of the first principal portion 341A is 50 μm to 100 μm, such as 50 μm, 60 μm, 70 μm, 80 μm, 90 μm, or 100 μm, and a maximum width W6 of the first secondary portion 342A is 10 μm to 40 μm, such as 10 μm, 15 μm, 20 μm, 25 μm, 30 μm, 35 μm, or 40 μm. When the maximum width is too small, it may make the radius of curvature of the curved surface too small, resulting in over-focusing the light. When the maximum width is too large, it may make the radius of curvature of the curved surface too large, and does not have a significant effect on focusing the light.

The first light emitting structure 311A is further described, and reference can be made to FIGS. 8 and 9. In some embodiments, a distance D5 between a lower surface of the first focusing optic 331A and upper surfaces of the first red light emitting diode 321A, the first green light emitting diode 322A and the first blue light emitting diode 323A is 10 μm to 150 μm, such as 10 μm, 30 μm, 50 μm, 70 μm, 90 μm, 110 μm, 130 μm, or 150 μm. When the distance is too small, it may make an error in controlling the emitting angle of the light emitted from the first focusing optic 331A, and an unexpected display displacement may occur. When the distance is too large, it may not have a significant effect on adjusting the emitting angle of the light.

In some embodiments, the light emitting diode structure 300 further includes a transparent layer 302, and reference is made to FIGS. 8 and 9. The features of the transparent layer 302 and the features related to the first red light emitting diode 321A, the first green light emitting diode 322A, the first blue light emitting diode 323A and the first focusing optic 331A are basically the same as the features of the transparent layer 202 and the features related to the at least one first red light emitting diode 221A, the first green light emitting diode 222A, the first blue light emitting diode 223A and the first focusing optic 231A. Therefore, the details can be referred to the above, and will not be repeated herein.

In some embodiments, the light emitting diode structure 300 further includes a protective layer 303, and reference is made to FIGS. 8 and 9. The features of the protective layer 303 and the features related to the first focusing optic 331A are basically the same as the features of the protective layer 203 and the features related to the first focusing optic 231A. Therefore, the details can be referred to the above, and will not be repeated herein.

In some embodiments, referring to FIG. 9, the light emitting diode structure 300 includes a second light emitting structure 311B next to the first light emitting structure 311A. The second light emitting structure 311B is basically the same as the first light emitting structure 311A, including, for example, a second red light emitting diode 321B, a second green light emitting diode 322B, a second blue light emitting diode 323B and a second focusing optic 331B corresponding to the first red light emitting diode 321A, the first green light emitting diode 322A, the first blue light emitting diode 323A and the first focusing optic 331A, respectively. Therefore, the details can be referred to the above, and will not be repeated herein. However, the position of the second secondary portion 342B of the second focusing optic 331B on the second principal portion 341B may be the same as or different from the position of the first secondary portion 342A of the first focusing optic 331A on the first principal portion 341A (e.g., referring to FIG. 9). The adjacent first light emitting structure 311A and the second light emitting structure 311B can not only compensate for each other's deficiencies through the arrangement of the light emitting diodes as described above, but also further compensate for the deficiencies (described later) of each other through the first secondary portion 342A and the second secondary portion 342B, so that the display quality can be further improved, such as avoiding the display displacement, improving the display resolution, and improving the display uniformity. Next, the position relationship between the first secondary portion 342A and the second secondary portion 342B is described in detail with the embodiments.

In some embodiments, referring to FIG. 9, the first secondary portion 342A is deviated from the center of the first principal portion 341A in a direction away from the second secondary portion 342B, and the second secondary portion 342B is deviated from the center of the second principal portion 341B in a direction away from the first secondary portion 342A, so that the first secondary portion 342A and the second secondary portion 342B are respectively located at the edges of the first focusing optic 331A and the second focusing optic 331B to compensate for the display displacement and the problems that may be caused by the edge effect, and the problem of Line Mura can be avoided because the first secondary portion 342A and the second secondary portion 342B are away from each other. In some embodiments, referring to FIG. 9, the center of the first secondary portion 342A is aligned with a first one of the first red light emitting diode 321A, the first green light emitting diode 322A and the first blue light emitting diode 323A, and the center of the second secondary portion 342B is aligned with a second one of the second red light emitting diode 321B, the second green light emitting diode 322B and the second blue light emitting diode 323B, and the light emitting color of the first one is different from the light emitting color of the second one, so that the first secondary portion 342A and the second secondary portion 342B control different types of light emitting diodes to avoid the problem of Line Mura.

The light emitting diode structure of the present disclosure not only well controls the emitting angle of the light from the light emitting diode, but also improves the display quality, such as improving the display resolution, avoiding Line Mura and avoiding display displacement.

The present disclosure is described in considerable detail in some embodiments, but other embodiments may also be feasible, so the scope and spirit of the claims should not be limited by the description of the embodiments contained in the present disclosure.

Those skilled in the art can make modifications and changes of the present disclosure, without departing from the scope and spirit of the present disclosure. Provided that the foregoing modifications and changes fall within the scope and spirit of the claims, these modifications and changes are covered by the present disclosure.

What is claimed is:

1. A light emitting diode structure, comprising:

a substrate;

a first light emitting structure on the substrate, wherein the first light emitting structure comprises a first light emitting diode and a first focusing optic, and the first focusing optic is on the first light emitting diode;

a second light emitting structure on the substrate, wherein the second light emitting structure comprises a second light emitting diode and a second focusing optic, and the second focusing optic is on the second light emitting diode; and a third light emitting structure on the substrate, wherein the third light emitting structure comprises a third light emitting diode and a third focusing optic, and the third focusing optic is on the third light emitting diode;

wherein the first light emitting structure, the second light emitting structure and the third light emitting structure are arranged along a first direction and are dislocated in a second direction perpendicular to the first direction, a pitch between a center of the first light emitting structure and a center of the second light emitting structure in the first direction is from 20 μm to 40 μm, and projections of the first light emitting structure and the second light emitting structure in the second direction have an overlap length from 0.1 μm to 10 μm.

2. The light emitting diode structure according to claim 1, wherein the second focusing optic has an edge tangent parallel to the second direction and extending through the first focusing optic or the third focusing optic.

3. The light emitting diode structure according to claim 1, wherein a virtual first line is between the center of the first light emitting structure and a center of the third light emitting structure, a virtual second line is between the center of the second light emitting structure and the center of the third light emitting structure, and an angle between the first virtual line and the second virtual line is from 30° to 60°.

4. The light emitting diode structure according to claim 1, wherein a first maximum width of the first focusing optic is 1.1 times to 2 times the pitch between the first light emitting structure and the second light emitting structure in the first direction.

5. The light emitting diode structure according to claim 1, wherein a first maximum width of the first focusing optic is 25 μm to 50 μm, a second maximum width of the second focusing optic is 25 μm to 50 μm, and a third maximum width of the third focusing optic is 25 μm to 50 μm.

6. The light emitting diode structure according to claim 1, wherein a first distance between a lower surface of the first focusing optic and an upper surface of the first light emitting diode is 10 μm to 150 μm, a second distance between a lower surface of the second focusing optic and an upper surface of the second light emitting diode is 10 μm to 150 μm, and a third distance between a lower surface of the third focusing optic and an upper surface of the third light emitting diode is 10 μm to 150 μm.

7. The light emitting diode structure according to claim 1, wherein the first light emitting diode, the second light emitting diode and the third light emitting diode are selected from the group consisting of a red light emitting diode, a green light emitting diode and a blue light emitting diode, and the light emitting colors of the first light emitting diode, the second light emitting diode and the third light emitting diode are different.

* * * * *